United States Patent [19]
Eres et al.

[11] Patent Number: 5,164,040
[45] Date of Patent: Nov. 17, 1992

[54] METHOD AND APPARATUS FOR RAPIDLY GROWING FILMS ON SUBSTRATES USING PULSED SUPERSONIC JETS

[75] Inventors: Diula Eres, Knoxville; Douglas H. Lowndes, Oak Ridge, both of Tenn.

[73] Assignee: Martin Marietta Energy Systems, Inc., Oak Ridge, Tenn.

[21] Appl. No.: 397,154

[22] Filed: Aug. 21, 1989

[51] Int. Cl.$^5$ .................................. C30B 25/14
[52] U.S. Cl. ...................... 156/610; 156/611; 156/612; 156/613; 156/614; 118/728; 118/730
[58] Field of Search ............ 156/610, 611, 612, 613, 156/614; 148/728, 730

[56] References Cited

U.S. PATENT DOCUMENTS

| | | | |
|---|---|---|---|
| 3,005,762 | 10/1961 | Fern ........................ | 156/610 |
| 3,839,084 | 10/1974 | Cho et al. ................. | 156/611 |
| 4,058,430 | 11/1977 | Suntola et al. ............ | 156/611 |
| 4,218,271 | 8/1980 | Wood ........................ | 156/612 |
| 4,449,286 | 5/1984 | Dahlberg ................... | 437/225 |
| 4,767,608 | 8/1988 | Matsumoto et al. ........ | 423/446 |

FOREIGN PATENT DOCUMENTS

| | | | |
|---|---|---|---|
| 59-162267 | 9/1984 | Japan ....................... | 156/610 |
| 63-282200 | 11/1988 | Japan ...................... | 423/446 |

OTHER PUBLICATIONS

Christionsen et al., "Turbulent Jetson Chemical Vapor Deposition", Chemical Engineering Progress, Dec. 1988.

M. Uzeki et al., "New Approach to the Atomic Layer Epitaxy, etc." Appl. Phys. Lett., vol. 53, #16, Oct. 17, 1988, pp. 1509-1511.

N. Kobayashi et al., "Flow-Rate Modulation Epitaxy of GaAs," Jpn. J. Appl. Phys., vol. 24, L962-L964 (1985).

W. T. Tsand, "Chemical Beam Epitaxy of InP and GaAs," Appl. Phys. Lett., vol. 45, pp. 1234-1236 (1984).

Djula Eres et al., "Pyrolytic & Lawer Photolytic Growth, etc., " Mat. Res. Soc. Symp. Proce., vol. 131, 1989.

G. J. Davies & D. Williams, "III-V MBE Growth Systems," in *The Technology & Physics of Molecular Beam Epitaxy*, pp. 15-46, Plenum Press, N.Y., 1985.

H. Luth, "Metalorganic Molecular Beam Epitaxy (MOMBE)", Inst. of Physics Conf. Series #82, ESSDERC-1986 Cambridge, England, Sep. 8-11 1986.

*Primary Examiner*—Robert Kunemund
*Attorney, Agent, or Firm*—J. Donald Griffin; Ivan L. Ericson

[57] ABSTRACT

A method and apparatus for the rapid and economical deposition of uniform and high quality films upon a substrate for subsequent use in producing electronic devices, for example. The resultant films are either epitaxial (crystalline) or amorphous depending upon the incidence rate and the temperature and structure of the substrate. The deposition is carried out in a chamber maintained at about $10^{-6}$ Torr. A gaseous source of the material for forming the deposit is injected into the deposition chamber in the form of a pulsed supersonic jet so as to obtain a high incidence rate. The supersonic jet is produced by a pulsed valve between a relatively high presure reservoir, containing the source gaseous molecules, and the deposition chamber; the valve has a small nozzle orifice (e.g., 0.1-1.0 mm diameter). The type of deposit (crystalline amorphous) is then dependent upon the temperature and structure of the substrate. Very high deposition rates are achieved, and the deposit is very smooth and of uniform thickness. Typically the deposition rate is about 100 times that of much more expensive conventional molecular beam methods for deposition, and comparable to certain expensive plasma-assisted CVD methods of the art. The high growth rate of this method results in a reduced contamination of the deposit from other elements in the environment. The method is illustrated by the deposition of epitaxial and amorphour germanium films upon GaAs substrates.

18 Claims, 3 Drawing Sheets

METHOD AND APPARATUS FOR RAPIDLY GROWING FILMS ON SUBSTRATES USING PULSED SUPERSONIC JETS

The U.S. Government has rights to this invention pursuant to Contract No. DE-AC05-84OR21400.

FIELD OF INVENTION

This invention relates generally to methods and equipment for the rapid vapor deposition of thin film materials upon heated substrates, and more particularly to supersonic free jet chemical beam epitaxial growth of crystalline materials upon heated substrates for the preparation of semiconductor and similar electronic devices.

BACKGROUND ART

In the preparation of certain semiconducting devices, it is common practice to grow a thin single crystalline film on a suitable crystalline substrate. The substrates and the films are selected so as to have nearly the same lattice spacing, i.e., nearly the same distance between atoms. Thus, the atom periodicity in the crystalline substrate acts as a template to define where the atoms for the crystalline film will deposit. If the films grow epitaxially (in registry), a single crystal film will result. Further, this film can be built upon sequentially to create the desired thickness of crystalline film material. In this art it is typical, for example, to grow single crystals of silicon and single crystals of germanium upon, respectively, substrates of silicon and gallium arsenide.

Several processes have been utilized in the prior art for the creation of these epitaxial crystalline films. One commonly used process is chemical vapor deposition (CVD). Generally, this involves introducing a gas containing the materials for deposit into an environment containing the substrate, which is heated, in order to decompose the gas molecules and release the atoms used to grow the films. Although this involves rather simple apparatus, the CVD film growth at low substrate temperature often results in a low deposition rate and in a nonuniform (rough) deposit. Higher substrate temperatures can be used to increase the CVD deposition rate but, in this case, there is often interdiffusion between the substrate and the deposit, resulting in various impurities being found in the deposit. Recently some improvement (increased deposition rate) in the CVD process has been made by utilizing plasma-assisted CVD deposition.

Another known method is referred to as "molecular beam epitaxy" (MBE). According to this method, atomic or molecular beams are generated by heating the solid elements in ovens (within the deposition chamber) from which a beam is emitted. In general, a separate oven is needed for each element that is to be deposited. Since the ovens are operated at elevated temperatures, the only control of vapor flow is through the use of mechanical shutters. Consequently, the elevated temperature portions of the apparatus must be elaborately shielded from the rest of the deposition chamber to minimize contamination of the deposit during slow growth. Because the atoms or molecules in these beams have only thermal velocities and the beams are of low intensity, MBE achieves a relatively slow deposition rate. A further disadvantage results from the necessity of opening the deposition chamber (and thus requiring re-evacuation) when the material in the oven is replaced. This method is described, for example, in "III-V MBE Growth Systems" by G. J. Davies and D. Williams, in *The Technology and Physics of Molecular Beam Epitaxy*, pp. 15–46, Plenum Press, NY (1985).

Still another process is "metalorganic molecular beam epitaxy" (MO-MBE). Gaseous sources (typically metalorganic molecules for elements in Column II and III, and hydrides for Column V and VI elements) are used. The sources are external to the deposition chamber, thus eliminating re-opening the deposition chamber to change sources. While gas flows can be switched more rapidly, mechanical shutters still are used to overcome switching transients common to mass flow controllers and to produce the desired very sharp on-off control that makes possible monolayer-by-monolayer growth. As with the MBE method, the deposition rate for the MO-MBE method is relatively slow because of the low velocity and intensity of the incident molecular beam. This method is typically described in "Metalorganic Molecular Beam Epitaxy (MOMBE)" by H. Luth in *Institute of Physics Conference Series No. 82*, ESS-DERC 1986, Cambridge England, Sept. 8–11, 1986.

A further prior art process is referred to as "chemical beam epitaxy" (CBE). In CBE metalorganic molecules are used to supply all of the Column II, III, V and VI elements. These are transported to the deposition chamber from an exterior liquid source "bubbler" using hydrogen or another carrier gas. Mass flow controllers and mechanical shutters are used for flow control and gas switching as in MO-MBE. However, the deposition rate is relatively slow. This method is typically described in "Chemical Beam Epitaxy of InP and GaAs" by W. T. Tsang in *Applied Physics Letters*, 45, pp. 1234–1236 (1984).

Another reference that is deemed to be material to this invention is "New Approach to the Atomic Layer Epitaxy of GaAs Using a Fast Gas Stream" by M. Ozeki, K. Mochizuki, N. Ohtsuka and K. Kodama in *Applied Physics Letters* 53, pp. 1509–1511 (1988). This describes the use of a jet nozzle to produce fast gas flow to prevent decomposition of the molecules of gas in the stagnant boundary layer that forms just above the film surface in a normal slow-moving gas stream. While switching of the jet flow is described, to limit film growth to one atomic layer at a time, the switching time is of the order of 1 to 10 seconds. Very slow deposition rates are reported for this method.

Accordingly, it is an object of the present invention to provide a method (and apparatus) for achieving controlled deposition of films upon a substrate with high deposition rates.

It is another object of the present invention to provide a controlled growth mode for producing epitaxial single crystals upon a crystalline substrate.

A further object is to provide a method for producing films having improved thickness uniformity and reduced roughness.

Also, it is an object to provide a method for achieving fabrication of sharp interfaces between thin film layers.

Yet a further object is to provide a method to use a directional beam of molecules to confine deposition to the region of the heated substrate.

Another object is to provide a method to enhance deposition on a heated substrate while minimizing deposition on the walls of the deposition chamber.

An additional object of the present invention is to provide for the reduced cost of the deposition of films for producing semiconductor and similar electronic devices.

These and other objects of the invention will become apparent upon a consideration of the figures referred to hereinafter together with a complete description thereof.

DISCLOSURE OF THE INVENTION

In accordance with the present invention, there is provided a method (and apparatus) that rapidly produces an extremely uniform and smooth epitaxial or amorphous deposit upon a substrate suitable for subsequently forming electronic devices, and with reduced cost for a given material. Specifically, molecules to be used for growth are entrained in a supersonic free jet expansion formed by a small nozzle orifice that is part of a pulsed valve. The nozzle orifice separates a high-pressure reservoir from the deposition chamber that is kept at low pressure by continuous pumping. Under these conditions the gas enters the chamber by what is referred to as a pulsed supersonic free-jet or "nozzle beam". By placing beam shaping elements downstream in the free-jet expansion, a supersonic beam can be obtained that is spatially narrow and highly directional. This helps to confine deposition only upon the substrate. In this case the beam is referred to as a supersonic molecular beam rather than a supersonic free jet. Accordingly, the invention encompasses the use of supersonic free jet/molecular beams for the deposition of films suitable for the subsequent manufacture of electronic devices.

BEST MODE FOR CARRYING OUT THE INVENTION

Figure 1:
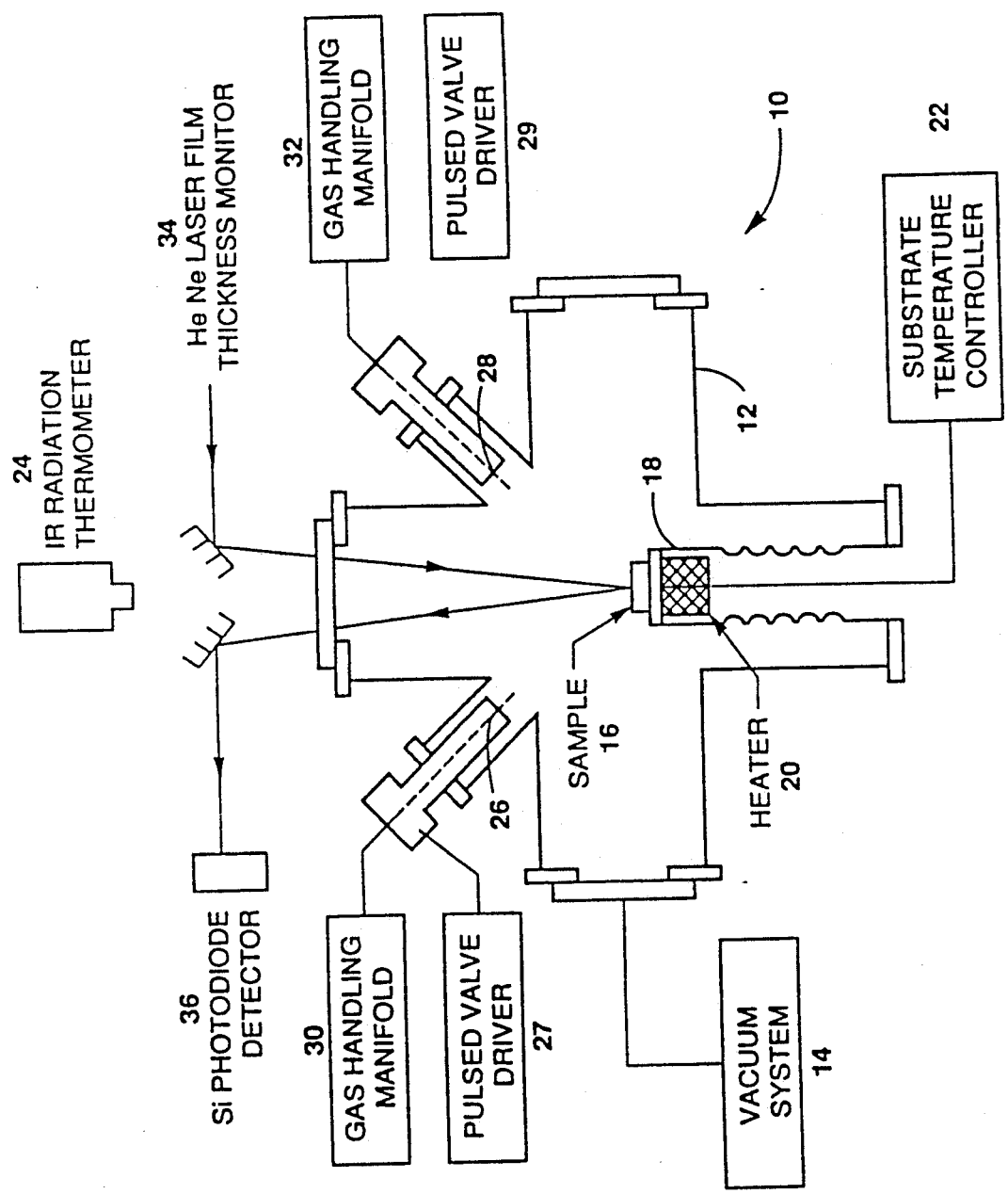
FIG. 1 is a drawing showing, schematically, apparatus for carrying out the method of the present invention.

Referring to FIG. 1, shown generally at 10 is typical apparatus for carrying out the method of the present invention. This shows, schematically, a reaction vessel 12 from the side. This can be, for example, a six-way turbo-pumped stainless steel cross. The vessel 12 is shown connected to any suitable vacuum system 14 for achieving about $10^{-6}$ Torr prior to deposition. A substrate (sample) 16 is positioned within the vessel on a support 18 to receive heat from a heater 20. This heater is supplied from a conventional temperature controller 22. The temperature of the substrate is maintained at a given selected value that is determined by the thermal decomposition rate(s) of the molecule(s) entrained in the pulsed supersonic jet. Typically this is in a range of about 350° to about 600° C. The temperature is measured by any suitable instrument: illustrated is an infrared radiation thermometer 24.

Although the present invention can be operated using a single source of gas, depicted in this figure are a pair of pulsed nozzles 26, 28. Typically, the nozzles of these sources are about 0.5 mm in diameter; however, they can be about 0.1–1.0 mm. Each of the nozzles is controlled by a driver unit 27, 29, respectively, and is fed from a high pressure gas handling manifold 30, 32, respectively. Typically the pressure in the manifolds is a few psi (1 psi=51.7 Torr), although it can range from a few Torr to about 200 psi. The high pressure, together with the low pressure of the deposition chamber (typically about $10^{-6}$ Torr), results in the injection of supersonic jets. By alternately pulsing the nozzles, epitaxial structures can be formed in which successive layers have different compositions (one composition from each source). Alloy layers can be formed from mutually reactive gases by pulsing the nozzles simultaneously. If, however, the source gases do not react upon mixing, they can be premixed in the manifolds (reservoirs) in the proportions needed for a particular alloy film and deposited from a single nozzle and reservoir. Typically, the pulse duration is in a range of about 200 microseconds to about one second. The specific duration and rate of pulsing depends upon the material being deposited and the desired characteristic of the deposited film. These pulses produce the high incidence rates and the high supersaturations that are the keys to the success of the present invention. It should be understood that the pulse repitition rates and durations are governed by the reservoir pressure and the speed of the vacuum pumping system.

There are several known means for measuring the thickness of the deposit upon the substrate 16. Illustrated in this FIG. 1 is a conventional He-Ne laser film thickness monitor 34 in which a laser beam is reflected from the deposit so as to impinge upon a silicon photodiode detector 36. The laser beam is actually reflected from the top and bottom interfaces of the growing film, giving rise to a series of interference oscillations in the reflected intensity. The characteristics of the oscillations are determined by the optical constants of the substrate and the deposit, as well as the surface morphology of the film. Thus, some properties of the film can be determined during the thickness measurement.

The method of the present invention was demonstrated by depositing films of germanium upon GaAs substrates. The substrate was first degreased by rinsing in trichloroethylene, acetone, methanol and deionized water, and then was chemically etched with a solution based upon sulfuric acid, hydrogen peroxide and water. Prior to loading into the deposition chamber, the substrate was rinsed with deionized water and blown dry with nitrogen. Before the deposition step, the substrate was thermally cycled to 550°–600° C. for five minutes in order to desorb any surface oxide and then it was taken to the film growth temperature.

Figure 2:
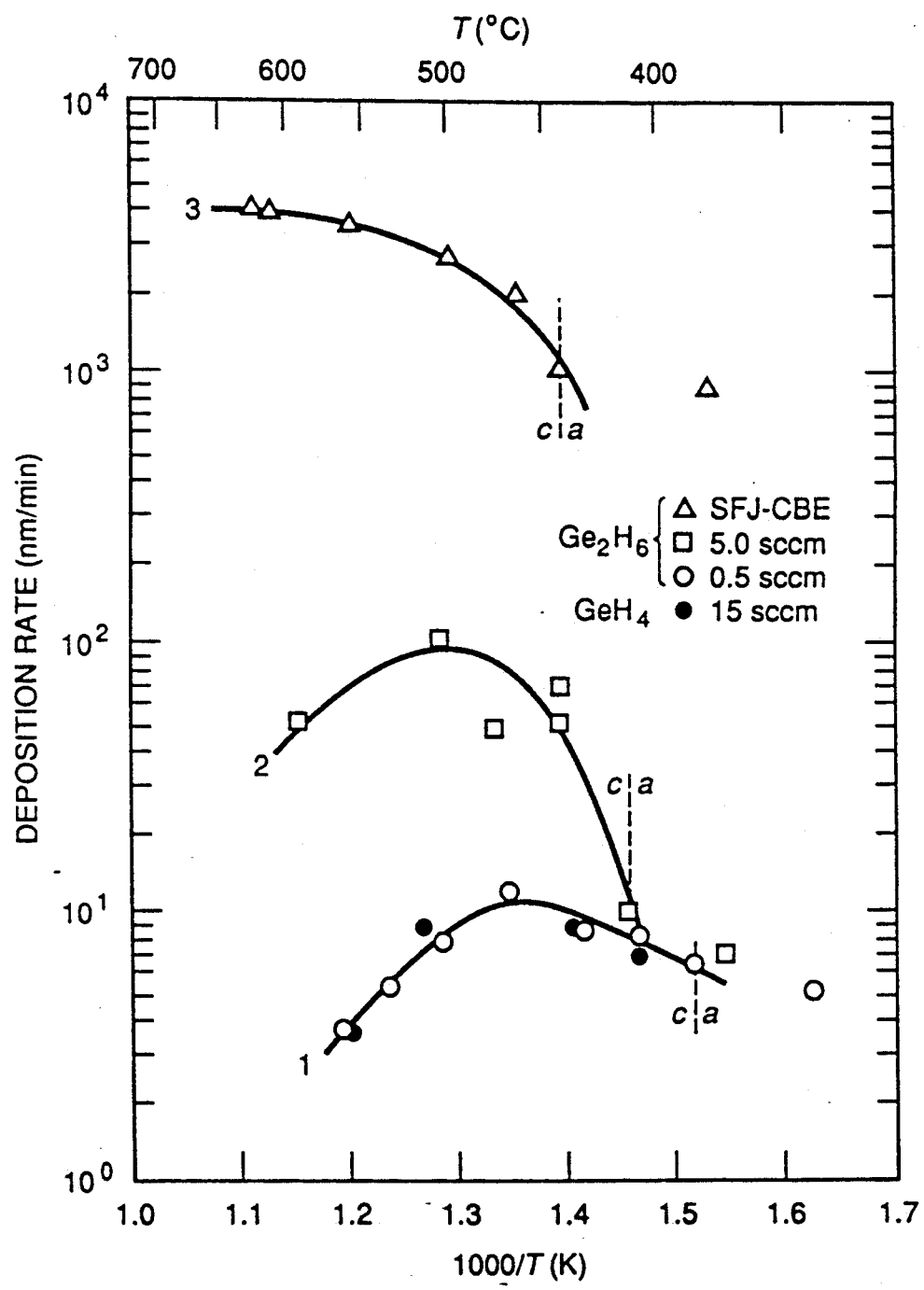
FIG. 2 is a plot showing the logarithm of deposition rate, as a function of reciprocal substrate temperature, for a deposit of the present invention and deposits made by conventional CVD methods.

Two germanium-containing gases were used as gaseous sources for deposition: digermane ($Ge_2H_6$) and germane ($GeH_4$). Typically these gases are added to a carrier gas (typically helium) to achieve about 5–10% concentration in the carrier gas. Plotted (as the logarithm of deposition rate versus reciprocal substrate temperature) in FIG. 2 are results of three separate series of depositions with digermane and one series with germane. The gas feed rates for the depositions using the prior art are indicated on the plot. Of these depositions, the series having the highest deposition rate was achieved using the pulsed jet of the present invention. The other depositions shown in the figure were carried out using conventional CVD. Epitaxial (crystalline) film growth rates of 15–60 nm/s were achieved using the pulsed supersonic jet at substrate temperatures of 450°–625° C. For each series of depositions there is a transition from amorphous deposition to crystalline deposition, with that transition indicated by the dashed line marked c/a: the temperature of this transition differs for different reactant gases and for different rates of deposition. The transition for the present invention, under the conditions utilized, was about 440° C. Thus, although the present invention has principal value in the formation of crystalline films, it can also be utilized to produce amorphous films very rapidly for selected applications.

Figure 3:
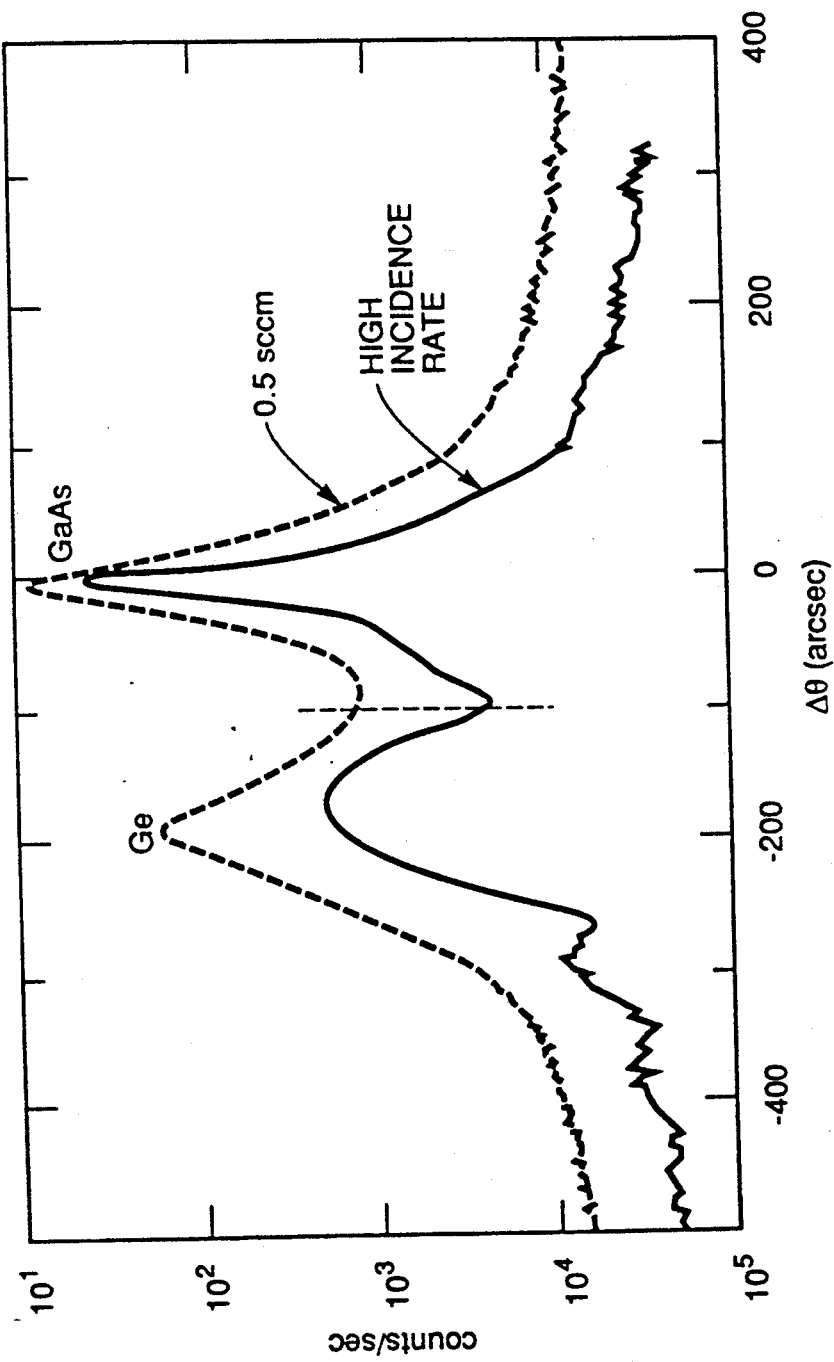
FIG. 3 is a plot of x-ray diffraction spectra from two films grown on GaAs substrates; one using the present invention, and the other using conventional low pressure CVD.

The epitaxial films produced using the present invention were very smooth and planar, being free of surface features or faceting, and had highly uniform thickness. These characteristics are superior to slowly-grown conventional CVD Ge films. Shown in FIG. 3 is a comparison of x-ray diffraction patterns from two films grown from a 5% digermane/95% helium mixture on GaAs substrates. The upper pattern (the dashed line) is that for a conventionally grown low pressure CVD deposit, and the lower pattern (solid line) is for a film grown using the present invention. The sidebands in the diffraction pattern of the film of the present invention show that it is highly planar and uniform in thickness. The broadened diffraction peaks of the CVD film are believed to be caused by nonuniform strain due to differential thermal expansion.

Although emphasis is placed upon the growth of epitaxial crystalline films, as discussed above there is a transition temperature between the formation of crystalline films and amorphous films. This transition can be controlled, not only by the substrate temperature, but also the incidence rate of the molecules, with amorphous films being formed above a certain incidence rate. Amorphous films have important applications in photovoltaic devices (e.g., hydrogenated amorphous silicon), in optical coatings (numerous ceramic materials), and in photocopying (chalcogenides), etc.

It has been demonstrated that epitaxial film growth rates of about 1 micrometer/min can be achieved for semiconductor materials. This is a factor of about 100 times faster than the growth rates obtained using MBE, MO-MBE and CBE, and is comparable to the fastest rates obtainable with plasma-assisted and high-pressure chemical vapor depositions processes. The kinetic energies of the film growth molecules entrained in the supersonic free jet apparently are in exactly the right energy range (above one electron volt) to assist the process of bond-breaking and atomic diffusion on the growing surface. The super thermal but still relatively low kinetic energies of the molecules, combined with the fact that they are electrically neutral (so that their interactions are of very short range) means that there is no significant danger of damage to the crystalline structure of the film or of the substrate. In contrast, substrate damage is known to occur by the electrically charged ions of higher energies that are used to assist crystalline film growth in processes such as plasma-assisted CVD and ion beam deposition.

The supersonic beams generated using a pulsed nozzle have additional practical advantages for depositions in which precursors to film growth are produced by excimer laser photolysis of parent gas molecules. For example, the use of a pulsed nozzle beam will completely remove gas molecules from the windows at the times that the excimer laser beam enters and exits the chamber thus eliminating film deposition on the windows. Further, the excimer lasers have a low duty cycle with typical pulse durations and repetition rates of 10-50 ns and 100 Hz, respectively. Thus, their fractional "on" time is typically $<10^{-5}$ in laser assisted CVD. Use of a pulsed nozzle with a minimum pulse duration of $<1$ ms helps to reduce this mismatch, resulting in more efficient pulsed laser CVD.

Although the single example of forming a film by the present method relates to germanium films, the method is applicable to all of the semiconductor materials that are currently deposited by other methods. This includes the deposition of silicon on a silicon substrate. Furthermore, the method has broader applications in the growth of metal and ceramic thin films, and multilayered thin film structures. This may include metals such as Al, Ga, In, W, Fe, etc., as well as cermaics such as $Al_2O_3$, MgO, $Si_3N_4$, etc. Since the gaseous material for deposition is delivered to the substrate by a highly directional and high velocity pulse, there is considerably less unused material deposited within the chamber, thus reducing the costs and time of cleaning the interior thereof. The more efficient use of incident molecules also has been discussed above with regard to the excimer laser irradiation. By placing beam-shaping elements (skimmers and collimators) downstream in the free-jet expansion a supersonic beam that is spatially narrow and highly directional is produced.

The conditions set forth herein are given for purposes of illustration and not to limit the present invention. The invention is to be limited only by the appended claims, and their equivalents, when taken together with the complete description of the invention.

We claim:

1. A method for rapidly growing thin and uniform deposits upon a substrate by thermal decomposition of a gaseous source for said deposits, which comprises the steps of:
   placing said substrate in a deposition chamber;
   producing within said deposition chamber a vacuum of about $10^{-6}$ Torr;
   heating said substrate to a selected temperature for said growing of said deposits, said selected temperature determined for optimizing said thermal decomposition;
   introducing at least one supersonic jet of gaseous material, containing high supersaturations said source for said deposits, into said deposition chamber directed toward said substrate resulting in high incidence rates and high supersaturations of said source materials with superthermal kinetic energies at said substrate; and
   pulsing said supersonic jet at a frequency.

2. The method of claim 1 wherein said deposits are selected from the group consisting of semiconductors, metals and ceramics.

3. The method of claim 1 wherein said deposits are crystalline.

4. The method of claim 1 wherein said deposits are amorphous.

5. The method of claim 1 wherein said substrate is heated to a selected temperature in the range of about 350° C. to about 600° C.

6. The method of claim 1 wherein said step of introducing said supersonic jet further comprises:
   producing a pressure within a source reservoir of from a few Torr to about 200 psi of said gaseous material containing said source of said deposit; and
   passing at least one pulse of said gaseous material through a small nozzle into said deposition chamber.

7. The method of claim 6 wherein said nozzle has a diameter of about 0.1 to about 1.0 mm.

8. The method of claim 1 wherein a plurality of pulsed supersonic jets of gaseous material containing sources for said deposit are introduced into said deposition chamber.

9. The method of claim 8 wherein said plurality of pulsed supersonic jets are pulsed at the same frequency and simultaneously.

10. The method of claim 8 wherein said plurality of pulsed supersonic jets are pulsed alternately.

11. A method for rapidly growing thin and uniform epitaxial deposits upon a substrate by thermal decomposition of a gaseous source for said deposits, which comprises the steps of:

placing said substrate in a deposition chamber;

producing within said deposition chamber a vacuum of about $10^{-6}$ Torr;

heating said substrate to a selected temperature for said growing of said epitaxial deposits;

introducing at least one supersonic jet of gaseous material into said deposition chamber directed toward said substrate, said gaseous material containing high supersaturations of said source for said deposits resulting in high incidence rates and high supersaturations of said source materials with superthermal kinetic energies at said substrate; and pulsing said supersonic jet at a frequency.

12. The method of claim 11 wherein said deposits are selected from the group consisting of semiconductors, metals and ceramics.

13. The method of claim 11 wherein a plurality of pulsed supersonic jets of gaseous material containing sources for said deposit are introduced into said deposition chamber.

14. The method of claim 11 wherein said step of introducing said supersonic jet further comprises:

producing a pressure within a source reservoir of from a few Torr to about 200 psi of said gaseous material containing said source of said deposit; and passing at least one pulse of said gaseous material through a small nozzle into said deposition chamber.

15. Apparatus for the rapid growing of thin and uniform deposits upon a substrate by thermal decomposition of a gaseous source for said deposits, which comprises:

a deposition chamber;

means for evacuating said deposition chamber to a pressure of about $10^{-6}$ Torr;

means for mounting said substrate within said deposition chamber;

means for heating said substrate to a selected temperature suitable for said growing of said deposits;

means for introducing at least one supersonic jet of gaseous material into said deposition chamber directed toward said substrate, said gaseous material containing high supersaturations of said source for said deposits resulting in high incidence rates and high supersaturations of said source materials with superthermal kinetic energies at said substrate; and means for pulsing said at least one supersonic jet at a selected frequency.

16. The apparatus of claim 15 wherein a plurality of means is provided for introducing a plurality of said supersonic jets into said deposition chamber; and means are provided with each of said plurality of jets for individually selecting the frequency of said jets.

17. The apparatus of claim 16 further comprising means for pulsing said plurality of jets at the same frequency simultaneously.

18. The apparatus of claim 15 wherein said means for introducing said at least one supersonic jet into said deposition chamber comprises:

reservoir means for said gaseous material, said reservoir means having an internal pressure from a few Torr to about 200 psi; and nozzle means connecting said reservoir means to said deposition chamber, said nozzle means having an orifice of about 0.1 to about 1.0 mm diameter.

* * * * *